United States Patent [19]

Kumanoya et al.

[11] Patent Number: 4,692,901
[45] Date of Patent: Sep. 8, 1987

[54] SEMICONDUCTOR MEMORY

[75] Inventors: Masaki Kumanoya; Kazuyasu Fujishima; Hideshi Miyatake; Hideto Hidaka; Katsumi Dosaka; Yasumasa Nishimura, all of Itami, Japan

[73] Assignee: Mitsubishi Denki Kabushiki Kaisha, Tokyo, Japan

[21] Appl. No.: 762,632

[22] Filed: Aug. 5, 1985

[30] Foreign Application Priority Data

Aug. 30, 1984 [JP] Japan .................... 59-183018
Aug. 30, 1984 [JP] Japan .................... 59-183019
Aug. 30, 1984 [JP] Japan .................... 59-183020

[51] Int. Cl.⁴ .............................. G11C 7/00
[52] U.S. Cl. ................ 365/201; 365/189
[58] Field of Search .......... 365/201, 189, 230; 371/21; 324/158 T

[56] References Cited

U.S. PATENT DOCUMENTS 4,061,908 12/1977 de Jonge et al. ................ 365/201

FOREIGN PATENT DOCUMENTS 59-63083 4/1984 Japan ........................ 365/201

OTHER PUBLICATIONS

Session X: Nonvolatile Memories, S. Tanaka et al., 1984 IEEE International Solid-State Circuits Conference, pp. 148 & 149, "A Programmable 256K CMOS EPROM with On-Chip Test Circuits".

Primary Examiner—Joseph A. Popek
Attorney, Agent, or Firm—Lowe Price LeBlanc Becker & Shur

[57] ABSTRACT

A semiconductor memory comprises memory cells (15-18, 27-30), a data writing terminal (1), a data readout terminal (48), transistors (3-10, 35-42), address signal input terminals (23-26), subdecode signal input terminals (43-46), driving signal generating circuits (49-52), parallel readout circuits (79-82) and test mode switching signal input terminal (53, 88). In writing of function test data for the memory cells, the driving signal generating circuits turn all of the transistors (3-10) on in response to a test mode switching signal with no regard to address signals, thereby to simultaneously write data in the memory cells (15-18). Further, in readout of the function test data for the memory cells, the parallel readout circuits read the storage contents of the memory cells (27-30) storing the test data in response to a test mode switching signal with no regard to subdecode signals. Logic circuit means (90, 91, 94) may be provided to output logical value corresponding to the test data stored in the memory cells when all of the logical values of the test data are at the same level.

12 Claims, 19 Drawing Figures

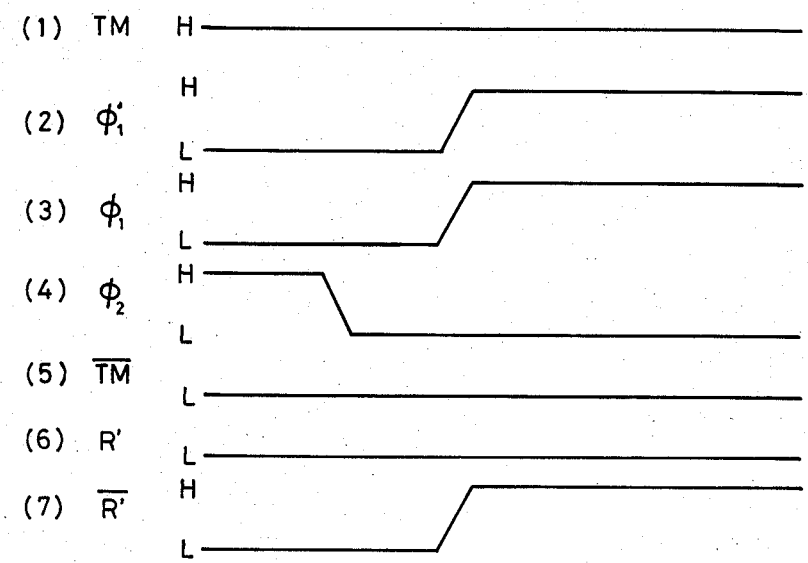
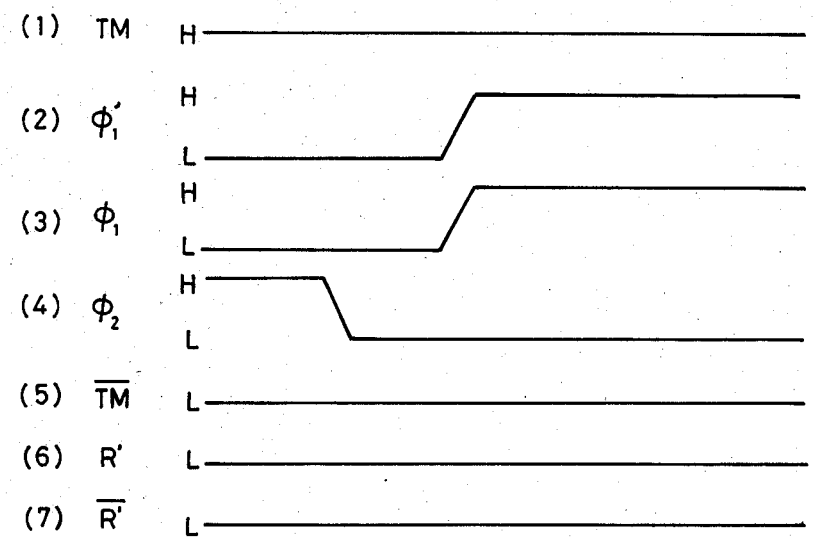

SEMICONDUCTOR MEMORY

BACKGROUND OF THE INVENTION

The present invention relates to a semiconductor memory, and more particularly, it relates to a semiconductor memory, the feature of which resides in the manner of writing and readout of test data in function tests of a plurality of memory cells.

Description of the Prior Art

In a conventional semiconductor memory, function tests of memory cells are performed in a wafer state of the semiconductor memory before the same is packaged. Such function tests are executed by transmission and reception of signals between a memory testing device and the semiconductor memory. For example, a prescribed logical value (e.g., "0") is written in all of the memory cells forming the semiconductor memory by the memory testing device. Then, the storage contents of the memory cells are read bit by bit to detect whether or not the storage contents match with the previously written logical values, thereby to make decisions as to whether or not the memory cells function correctly. In the conventional semiconductor memory, writing and readout of test data in and from the respective memory cells for such function tests are performed through normal input/output circuits.

FIG. 1 is a schematic block diagram mainly showing electrical structure of an input (writing) circuit of a conventional semiconductor memory.

Description is now made on the structure of the semiconductor memory as shown in FIG. 1. In FIG. 1, input data W are supplied to a data input buffer 2 through a data writing terminal 1. In response to this, the data input buffer 2 outputs the input data W and signals $\overline{W}$ obtained by inverting the input data W. The signals W outputted from the data input buffer 2 are supplied to one conducting terminal of each of transistors 3, 5, 7 and 9, while the signals $\overline{W}$ outputted from the data input buffer 2 are further supplied to one conducting terminal of each of transistors 4, 6, 8 and 10. Outputs from respective other conducting terminals of the transistors 3 and 4 are amplified through a preamplifier 11, to be coupled with a 1-bit memory cell 15. In a similar manner, outputs from respective other conducting terminals of the transistors 5 and 6 are amplified through a preamplifier 12 to be coupled with a 1-bit memory cell 16 and outputs from the respective other conducting terminals of the transistors 7 and 8 are amplified through a preamplifier 13 to be coupled with a 1-bit memory cell 17 while outputs from respective other conducting terminals of the transistors 9 and 10 are amplified through a preamplifier 14 to be coupled with a 1-bit memory cell 18. On off operations of the transistors 3 and 4 are controlled by an output signal $C_1$ from a memory cell selecting circuit 19 and on off operations of the transistors 5 and 6 are controlled by an output signal $C_2$ from a memory cell selecting circuit 20, while on off operations of the transistors 7 and 8 are controlled by an output signal $C_3$ from a memory cell selecting circuit 21 and on off operations of the transistors 9 and 10 are controlled by an output signal $C_4$ from a memory cell selecting circuit 22. A terminal 23 receives an address signal $A_R$ and a terminal 24 receives an address signal $\overline{A_R}$ while a terminal 25 receives an address signal $A_C$ and a terminal 26 receives an address signal $\overline{A_C}$, whereby one of the memory cell selecting circuits 19 to 22 is selected to be driven.

Description is now made on the data writing operation in the function tests of the conventional semiconductor memory as shown in FIG. 1. In the data writing operation, the input data W are supplied to the data writing terminal 1. The data input buffer 2 outputs a complementary pair of signals W and $\overline{W}$. In order to make the signals W and $\overline{W}$ reach the respective memory cells to be written therein, the transistors 3 to 10 must be in ON states. In the conventional semiconductor memory, a pair of transistors (for example, transistors 3 and 4) are turned on by one of the memory cell selecting circuits designated by the address signal $A_R$, $\overline{A_R}$, $A_C$ or $\overline{A_C}$, whereby the data are written only in one of the 1-bit memory cells (for example, memory cell 15). Then the address signals are changed so as to sequentially designate the other memory cell selecting circuits and write the data in the respective memory cells bit by bit in a sequential manner.

FIG. 2 is a schematic block diagram mainly showing electrical structure of an output (readout) circuit of the conventional semiconductor memory.

The structure of the semiconductor memory as shown in FIG. 2 is now described. In FIG. 2, storage contents of memory cells 27, 28, 29 and 30 are read into corresponding preamplifiers 31 to 34. The preamplifiers 31 to 34 respectively generate signals $\overline{R_1}$ to $\overline{R_4}$ obtained by inverting signals $R_1$ to $R_4$ read from the memory cells 27 to 30, thereby to output pairs of signals $R_1$ and $\overline{R_1}$, $R_2$ and $\overline{R_2}$, $R_3$ and $\overline{R_3}$ and $R_4$ and $\overline{R_4}$ which are in complementary relations each other respectively. The signals outputted from the preamplifiers 31 to 34 (hereinafter referred to as internal output signals) are coupled in a line respectively through conducting paths of transistors 35, 37, 39 and 41, to be supplied to one input terminal of a main amplifier 47 as a signal R. The internal output signals $\overline{R_1}$ to $\overline{R_4}$ are coupled in a line respectively through conducting paths of transistors 36, 38, 40 and 42 to be supplied to the other input terminal of the main amplifier 47. These input signals are amplified by the main amplifier 47, to be supplied to an external output terminal 48 as an external output signal.

Description is now made on the signal readout operation in the function test of the semiconductor memory as shown in FIG. 2.

In FIG. 2, it is assumed that logical values of "0" are previously written by a memory testing device in all of the memory cells 27 to 30. The logical values of "0" stored in the respective memory cells 27 to 30 are read into the preamplifiers 31 to 34, which in turn output the logical values $R_1$ to $R_4$ ("0") read from the memory cells 27 to 30 and the signals $\overline{R_1}$ to $\overline{R_4}$ ("1") being in complementary relations thereto as the internal output signals. The internal output signal to be read at the external output terminal 48 is selected among those outputted from the preamplifiers 31 to 34 by converting one of subdecode signals supplied to subdecode signal input terminals 43 to 46 to a high level. For example, when a high-level subdecode signal is supplied only to the input terminal 43, the transistors 35 and 36 alone are made conductive so that the internal output signals $R_1$ and $\overline{R_1}$ of the preamplifier 31 are supplied to the main amplifier 47 as R and $\overline{R}$ to be amplified and outputted from the external output terminal 48. In order to read the remaining internal output signals $R_2$ to $R_4$ and $\overline{R_2}$ to $\overline{R_4}$, the other subdecode signals supplied to the other subdecode signal input terminals 44, 45 and 46 may be sequentially converted into high levels. Thus, the logical values for function tests written in the memory cells are read bit by bit at the external output terminal, thereby to individually decide the conditions of the respective memory cells.

In the conventional semiconductor memory as hereinabove described, since the test data must be written in a plurality of memory cells bit by bit and the storage contents of the plurality of memory cells must be read out bit by bit by utifizing normal input/output circuits, the time for the function test per semiconductor memory is extremely prolonged because of mass storage of the semiconductor memory. On the other hand, it is known in the art to simultaneously test a plurality of bits by providing on-chip test circuits such as retention test circuits and stress test circuits as disclosed in, for example, "A Programmable 256K CMOS EPROM with On-Chip Test Circuits" by S. Tanaka et al, 1984 IEEE International Solid-State Circuits Conference, pages 148 to 149, whereas no concept has yet been known as to simultaneous performance of writing and/or readout of function test data of a plurality of memory cells.

SUMMARY OF THE INVENTION

Briefly stated, the present invention provides a semiconductor memory which comprises a data writing terminal, n-bit memory cells (n: an integer not less than 2) coupled in a parallel manner to the data writing terminal, designating signal generating means for generating signals designating any one of the memory cells to be written with data, the number n of memory cell writing means each provided for respective ones of the memory cells for receiving the memory cell designating signals to write the data in the designated memory cells and driving signal generating means for generating driving signals for simultaneously driving all of the number n of memory cell writing means in writing of data for the memory cell function tests.

According to another aspect of the present invention, the semiconductor memory comprises n-bit memory cells, the number n of internal output signal generating means each provided for respective ones of the memory cells for reading logical values held in the respective memory cells, signal selecting means for selecting one from the number n of logical values outputted from respective ones of the internal output signal generating means, a data readout terminal for externally outputting the logical value selected by the signal selecting means, a test data output means connected to the number n of internal output signal generating means for outputting memory cell function test data and a test mode switching means for activating the test data output means only in readout of the data for the memory cell function tests.

According to still another aspect of the present invention, the semiconductor memory comprises a data writing terminal, n-bit memory cells coupled in parallel with the data writing terminal, a designating signal generating means for generating signals designating any one of the memory cells to be written with data, the number n of memory cell writing means each provided for respective one of the memory cells for receiving the memory cell designating signals thereby to write data in the designated memory cells, driving signal generating means for generating driving signals for simultaneously driving all of the number n of memory cell writing means in writing of data for the memory cell function tests, the number n of internal output signal generating means each provided for respective ones of the memory cells to read logical values held in the respective memory cells, signal selecting means for selecting one from the number n of logical values outputted from the respective internal output signal generating means, a data readout terminal for externally outputting the logical value selected by the signal selecting means, a test data output means connected to the number n of internal output signal generating means to output memory cell function test data and a test mode switching means for activating the test data output means only in readout of the memory cell function test data.

According to a further aspect of the present invention, the test data output means are implemented by the number n of parallel readout means for directly outputting the number n of logical values outputted from the number n of internal output signal generating means in a parallel manner.

According to a still further aspect of the present invention, the test data output means is implemented by logic circuit means which outputs, when all of the number n of logical values outputted from the number n of internal output signal generating means are at the same level, the said logical value.

Accordingly, a principal object of the present invention is to provide a semiconductor memory which can remarkably reduce the time for function tests of memory cells.

A principal advantage of the present invention is that a plurality of memory cell writing means are simultaneously driven in writing of memory cell function test data thereby to simultaneously write the same test data in the plurality of memory cells.

Another advantage of the present invention is that the storage contents of a plurality of memory cells can be simultaneously read in readout of memory cell function test data.

Still another advantage of the present invention is that the storage contents of a plurality of bits (n bits) of memory cells are externally outputted in a parallel manner thereby to perform function tests of the plurality of bits of memory cells in a parallel manner, whereby the time for reading the memory cells in the function tests can be reduced to 1/n of that of the conventional memory per bit.

A further advantage of the present invention is that a plurality of bits (n bits) of memory cells can be simultaneously subjected to function tests by externally outputting, when all of the logical values read from the plurality of bits of memory cells are at the same level, the said logical value, whereby the time for testing the memory cells can be reduced to 1/n of that in the conventional memory per bit.

The above and other objects, features, aspects and advantages of the present invention will become more apparent from the following detailed description of the present invention when taken in conjunction with the accompanying drawings.

BRIEF DESCRIPTION OF THE DRAWINGS

FIGS. 10A to 10D are waveform diagrams for illustrating the operations of the circuit as shown in FIG. 9;

DESCRIPTION OF THE PREFERRED EMBODIMENTS

Figure 3:
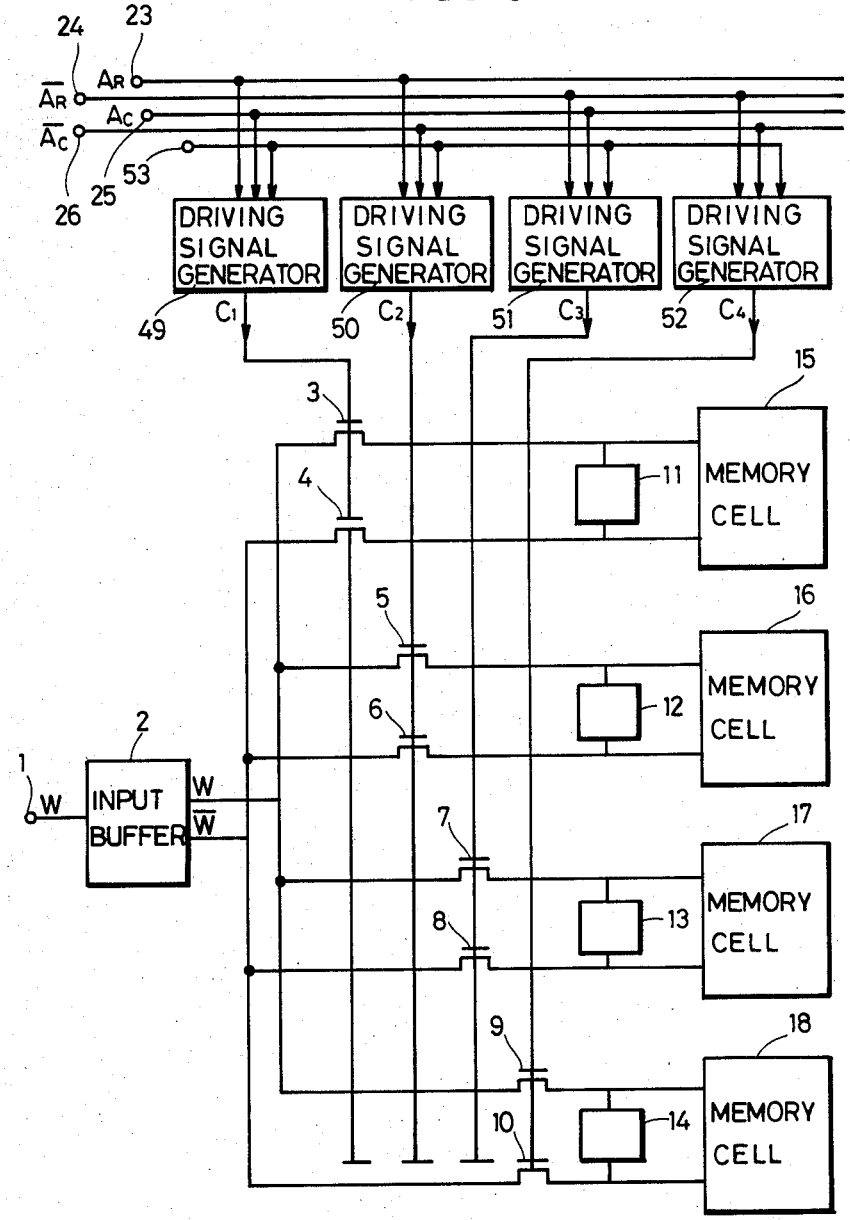
FIG. 3 is a schematic block diagram showing a semiconductor memory according to an embodiment of the present invention.

FIG. 3 is a schematic block diagram showing electrical structure of a writing circuit of a semiconductor memory according to an embodiment of the present invention.

Figure 1:
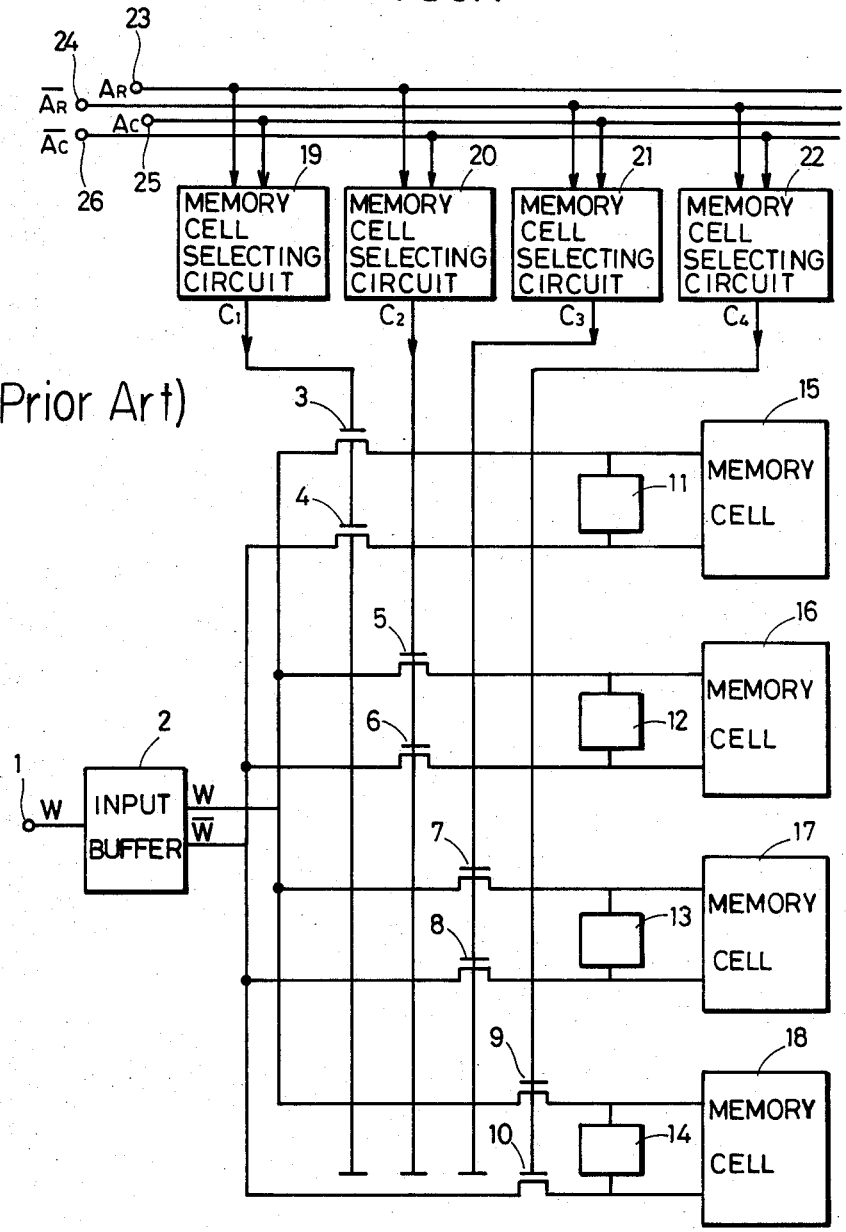
FIG. 1 is a schematic block diagram showing electrical structure of a writing circuit of a conventional semiconductor memory.

The structure of the embodiment as shown in FIG. 3 is identical to that of the conventional semiconductor memory as shown in FIG. 1, except for the following points: Driving signal generating circuits 49 to 52 are provided in place of the memory cell selecting circuits 19 to 22 and a test mode switching signal (TM signal) input terminal 53 is adapted to supply the TM signal to the respective driving signal generating circuits 49 to 52.

The operation of the embodiment as shown in FIG. 3 is now described. The TM signal rises at high level in a test mode, and in a mode (hereinafter referred to as normal mode) other than the test mode, i.e., when the TM signal is at low level, the respective driving signal generating circuits 49 to 52 operate in a similar manner to the memory cell selecting circuits 19 to 22 as shown in FIG. 1. Namely, when the TM signal is at low level, one of the driving signal generating circuits selected by address signals $A_R$, $\overline{A_R}$, $A_C$ and $\overline{A_C}$ operates to control a pair of transistors related thereto to enter ON states, thereby to write input data in one of the memory cells designated by the aforementioned address signals in conventional procedure.

On the other hand, in the test mode, i.e., when the TM signal rises at high level, all of the driving signal generating circuits 49 to 52 simultaneously output signals $C_1$ to $C_4$ for driving related pairs of the transistors to enter ON states respectively, regardless of the address signals. In other words, when the TM signal is at high level, all of transistors 3 to 10 enter ON states, whereby output signals W and $\overline{W}$ from a data input buffer 2 are written in all of memory cells 15 to 18.

Figure 4:
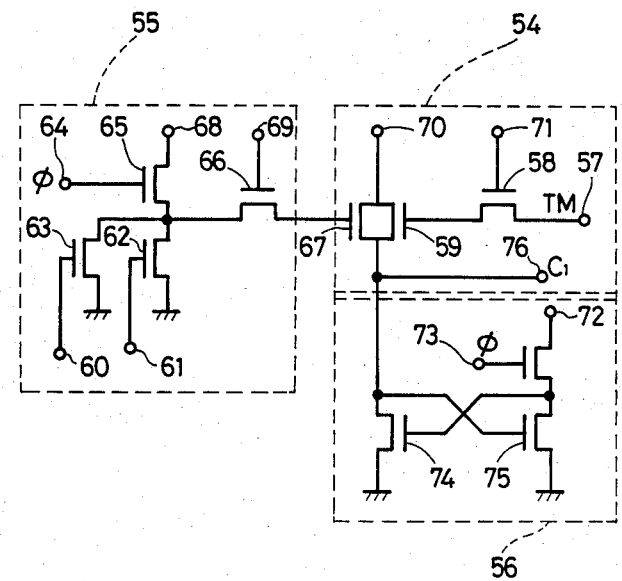
FIGS. 4 and 5 are circuit diagrams showing driving signal generating circuits forming the embodiment of the present invention.

The driving signal generating circuits 49 to 52 are all in the same circuit structure, and FIG. 4 shows a detailed circuit diagram thereof with respect to the driving signal generating circuit 49, which is taken here as an example for illustration.

Description is now made on the structure of the driving signal generating circuit 49 as shown in FIG. 4. The circuit as shown in FIG. 4 is mainly formed by a driving signal generating portion 54, a memory cell selecting portion 55 and a latch circuit 56. A terminal 57 receives the TM signal from a terminal 53 as shown in FIG. 3. The TM signal is supplied to the control terminal of a transistor 59 through a transistor 58.

On the other hand, both of terminals 60 and 61 receive low-level signals when the address signals $A_R$ and $A_C$ are adapted to select the driving signal generating circuit 49. In this case, transistors 62 and 63 enter OFF states. A terminal 64 receives basic clock signals $\phi$ for deciding the timing for memory cell writing. A transistor 65 is on off controlled by the clock signals $\phi$, while one conducting terminal thereof is coupled to transistors 62, 63 and 66. The other conducting terminal of the transistor 66 is coupled with the control terminal of a transistor 67. Terminals 68, 69, 70 and 71 receive high-level signals. The latch circuit 56 is formed by a terminal 72 for supplying high-level signals, a terminal 73 receiving the aforementioned basic clock signals $\phi$ and transistors 74 and 75, to be controlled by the clock signals $\phi$, thereby to previously make a terminal 76 at a low level.

The operation of the circuit as shown in FIG. 4 is now described. In the normal mode, i.e., when the TM signal is at low level, the transistor 59 enters an OFF state. When the memory cell selecting portion 55 in place functions as a normal memory selecting circuit and the driving signal generating circuit 49 is selected by the address signals, the transistors 62 and 63 both enter OFF states and high-level signal is supplied to the control terminal of the transistor 67 in accordance with the clock signals $\phi$, whereby the transistor 67 enters an ON state. In response to this, the terminal 76 outputs the high-level signal $C_1$, thereby to make the related transistors 3 and 4 enter ON states.

On the other hand, in the test mode, i.e., during the period when the TM signal is at high level, the transistor 59 is continuously in an ON state, so that the high-level signal $C_1$ is continuously outputted at the terminal 76 to make the related transistors 3 and 4 enter ON states regardless of the address signals.

Figure 5:
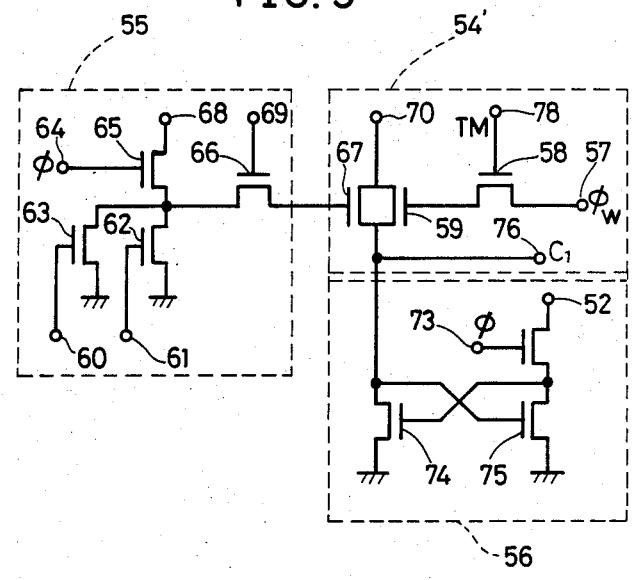

FIG. 5 is a circuit diagram showing a driving signal generating circuit which makes related transistors enter ON states only when the writing operation to the memory cells is further performed in the aforementioned test mode. In FIG. 5, signals $\phi_W$ are converted into high levels when writing is actually made in the memory cells in the test mode. The structure of the circuit diagram as shown in FIG. 5 is identical to that of the circuit diagram as shown in FIG. 4 except for the following points: The signals $\phi_W$ are supplied to one conducting terminal of a transistor 58 through a terminal 57, while the control terminal of a transistor 58 receives TM signal through a terminal 78. Thus, a terminal 76 outputs driving signals $C_1$ only when both of the TM signal and the signals $\phi_W$ are at high level, thereby to make the related transistors 3 and 4 enter ON states.

Therefore, according to this embodiment, the same test data can be simultaneously written in a plurality of memory cells in the function tests thereof.

Figure 6:
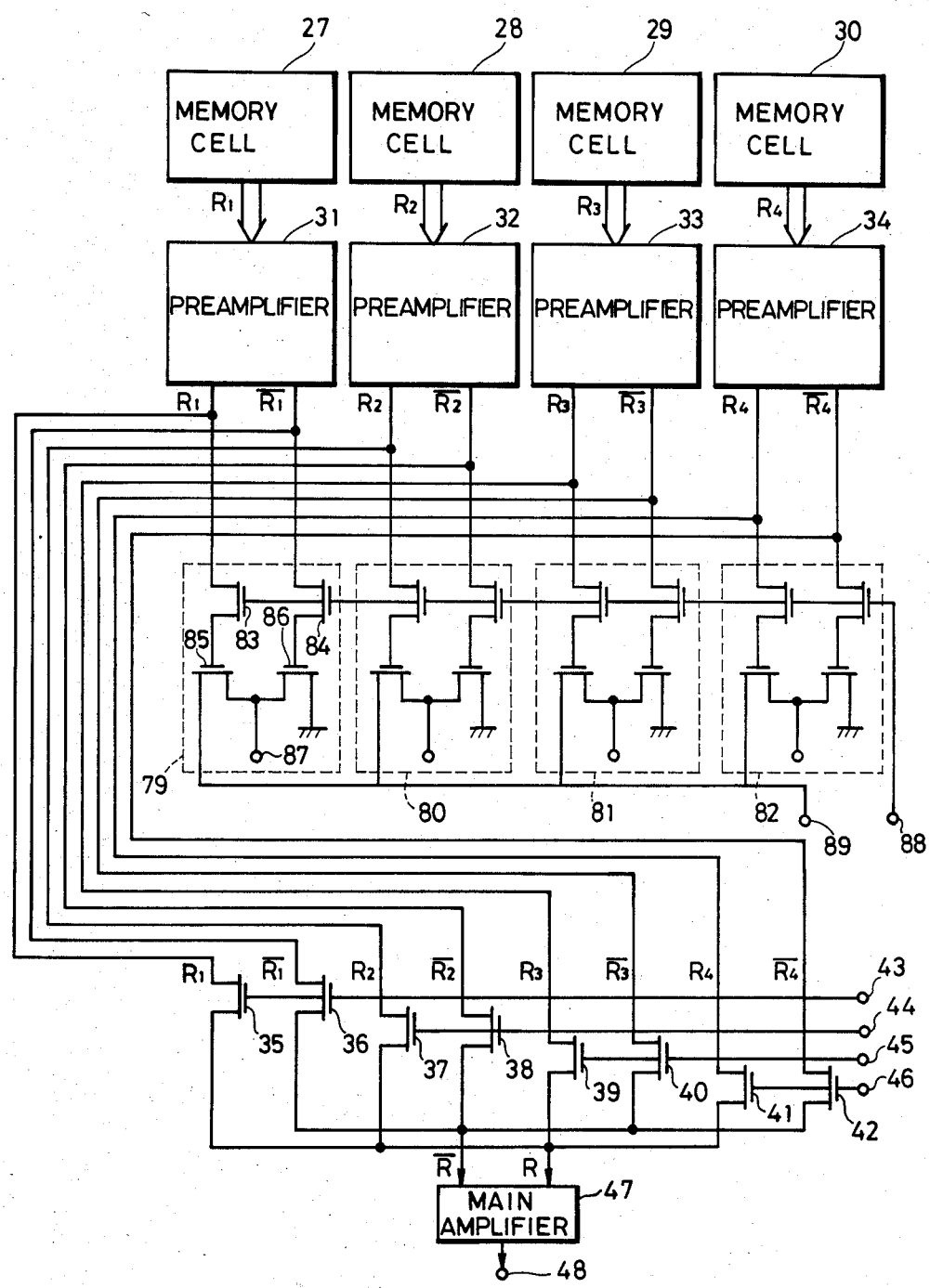
FIG. 6 is a schematic block diagram showing a semiconductor memory according to a second embodiment of the present invention.

FIG. 6 is a schematic block diagram showing electrical structure of a readout circuit of a semiconductor memory according to a second embodiment of the present invention.

Figure 2:
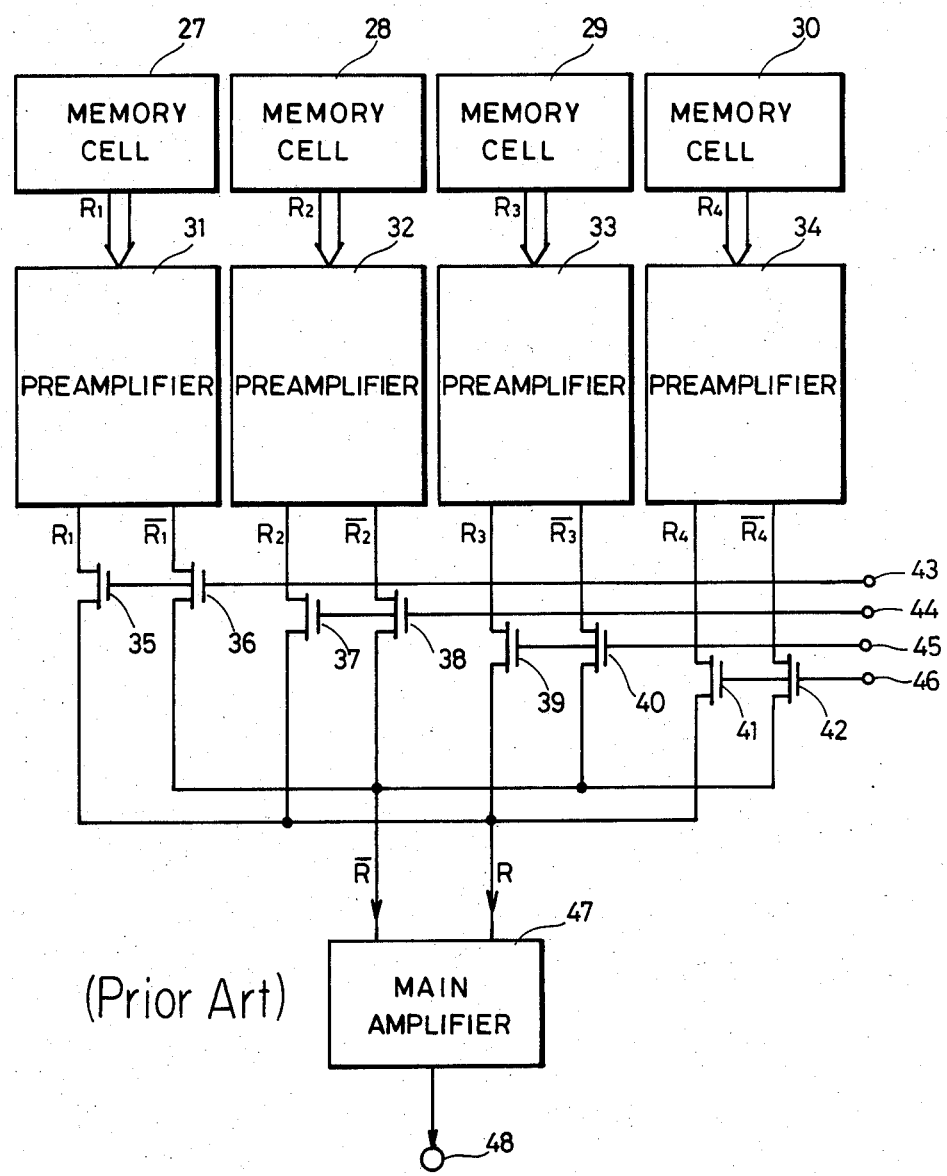
FIG. 2 is a schematic block diagram showing electrical structure of a readout circuit of the conventional semiconductor memory.

The structure of the embodiment as shown in FIG. 6 is the same as that of the conventional semiconductor memory as shown in FIG. 2 except for the following points: Namely, parallel readout circuits 79 to 82 are provided in correspondence to respective ones of preamplifiers 31 to 34. The parallel readout circuits 79 to 82 are in the same structure, and detailed description is now made on the parallel readout circuit 79 which is taken as an example for illustration. Internal output signal $R_1$ of the preamplifier 31 is coupled to the control terminal of a transistor 85 through a transistor 83 forming the parallel readout circuit 79. In a similar manner, internal output signal $\overline{R_1}$ of the preamplifier 31 is supplied to the control terminal of a transistor 86 through a transistor 84. The control terminals of the transistors 83 and 84 are coupled to an input terminal 88 for test mode switching signal generated by a memory testing device and converted into high levels in the test mode. Further, one conducting terminal of each transistors 85 and 86 are coupled with each other to form a parallel external output terminal 87, while the other conducting terminal of the transistor 85 is connected to a voltage supply terminal 89 for supplying prescribed voltage which is generated by the memory test unit and rises in readout of parallel signals, and the other conducting terminal of the transistor 86 is grounded.

Figure 7A:
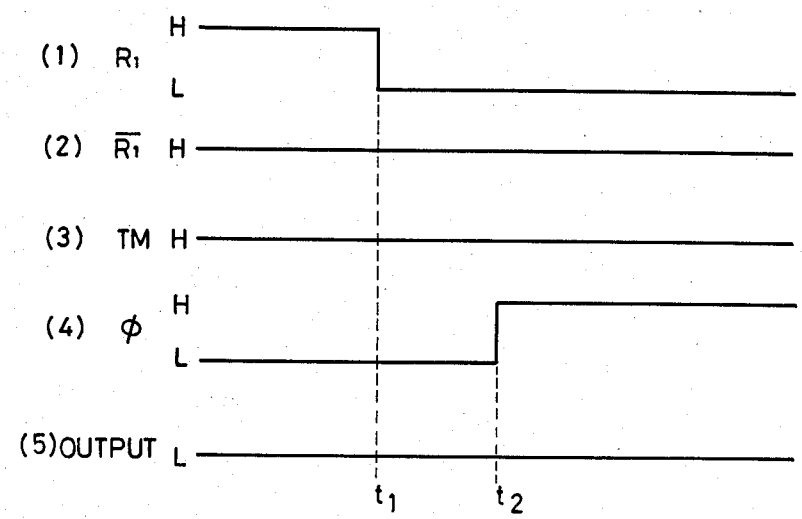
FIGS. 7A and 7B are waveform diagrams for illustrating the operations of the semiconductor memory as shown in FIG. 6.
Figure 7B:
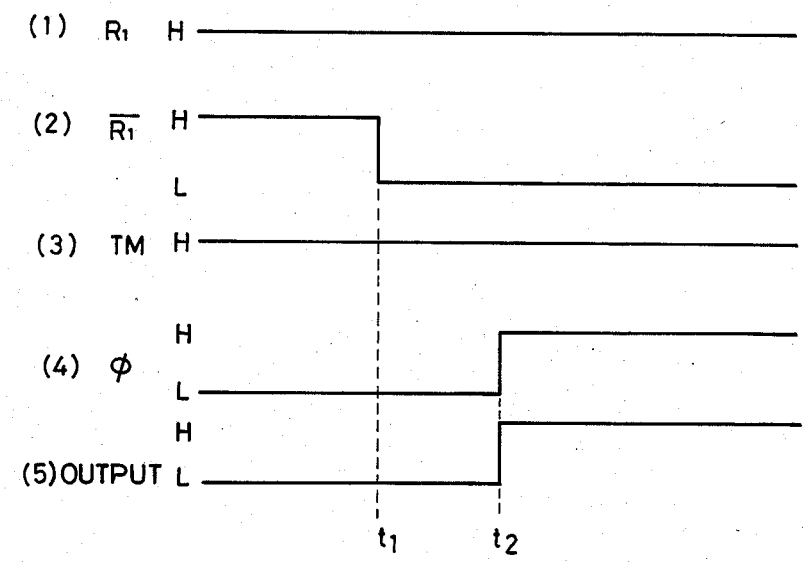

FIGS. 7A and 7B are waveform diagrams for illustrating the operations of the second embodiment as shown in FIG. 6.

Description is now made on the operations of the second embodiment of the present invention with reference to FIGS. 7A and 7B.

In order to perform function tests of the memory cells, logical values of "0" are written in all of the memory cells by a memory testing device (not shown). If the respective memory cells function correctly, the logical values of "0" will be read from the same while those are decided as defective if no "0" output is obtained. Assuming that the respective memory cells function correctly in the embodiment as shown in FIG. 6, the internal output signals $R_1$ to $R_4$ read by the preamplifiers 31 to 34 become "0" and the complementary signals $\overline{R_1}$ to $\overline{R_4}$ thereof will become "1". The operation of the parallel readout circuit 79 is now described particularly with respect to the case of $R_1 = $ "0" and $\overline{R_1} = $ "1". As shown at (1) and (2) in FIG. 7A, the preamplifier 31 outputs the internal output signals $R_1$ and $\overline{R_1}$ after the time $t_1$. In other words, the signal $R_1$ is equal to "0" or at low level and the signal $\overline{R_1}$ is equal to "1" or at high level after the time $t_1$, as hereinabove described. Symbol TM as shown at (3) in FIG. 7A indicates the aforementioned test mode switching signal, which is maintained at high level in the test mode. Namely, the transistors 83 and 84 enter conductive states in the test mode, whereby the internal output signals $R_1$ and $\overline{R_1}$ are supplied to the main amplifier 47 through conventional signal selecting means as well as to the control terminals of the transistor 85 and 86 through the transistors 83 and 84, respectively. Symbol $\phi$ at (4) in FIG. 7A indicates a signal supplied to the terminal 89 for determining the timing for reading the parallel signals as hereinabove described, which is converted into high level after the time $t_2$ to supply prescribed voltage. This signal $\phi$ is supplied to one conducting terminal of the transistor 85 from the input terminal 89. In this state, the control input of the transistor 85, i.e., $R_1$ is at low level and the control input of the transistor 86, i.e., $\overline{R_1}$ is at high level, and hence the transistor 85 is in an OFF state while the transistor 86 is in an ON state. In other words, a low level signal is outputted at the parallel external output terminal 87 in this state.

FIG. 7B is a waveform diagram for illustrating the operation in the case where logical values of "1" are written in all of the memory cells contrary to the case of FIG. 7A. In this case, the signal $R_1$ is at high level and the signal $\overline{R_1}$ is at low level as shown at (1) and (2) in FIG. 7B, and hence the transistor 85 is in an ON state while the transistor 86 is in an OFF state. Namely, a high level signal is outputted at the parallel external output terminal 28 as shown at (5) in FIG. 7B. As obvious from FIGS. 7A and 7B, the signal "0" is directly outputted at the parallel external output terminal 87 when the values of "0" are held in the memory cells while the signal "1" is outputted at the same when the values of "1" are held in the memory cells. All of the parallel readout circuits 79 to 82 are in the same circuit structure, and hence the respective parallel readout circuits perform the same operation as that described above with reference to FIGS. 7A and 7B. Thus, the storage contents of the respective memory cells are externally outputted in a parallel manner through corresponding ones of the parallel readout circuits.

The aforementioned function tests of the memory cells are performed in a wafer state of the semiconductor memory before the same is packaged, and the test mode switching signal input terminal 88 may be grounded to be at a low level when the memory is packaged after the function tests, so that only a normal readout circuit functions thereafter.

Thus, function tests of a plurality of bits of memory cells can be simultaneously performed according to the second embodiment.

Figure 8:
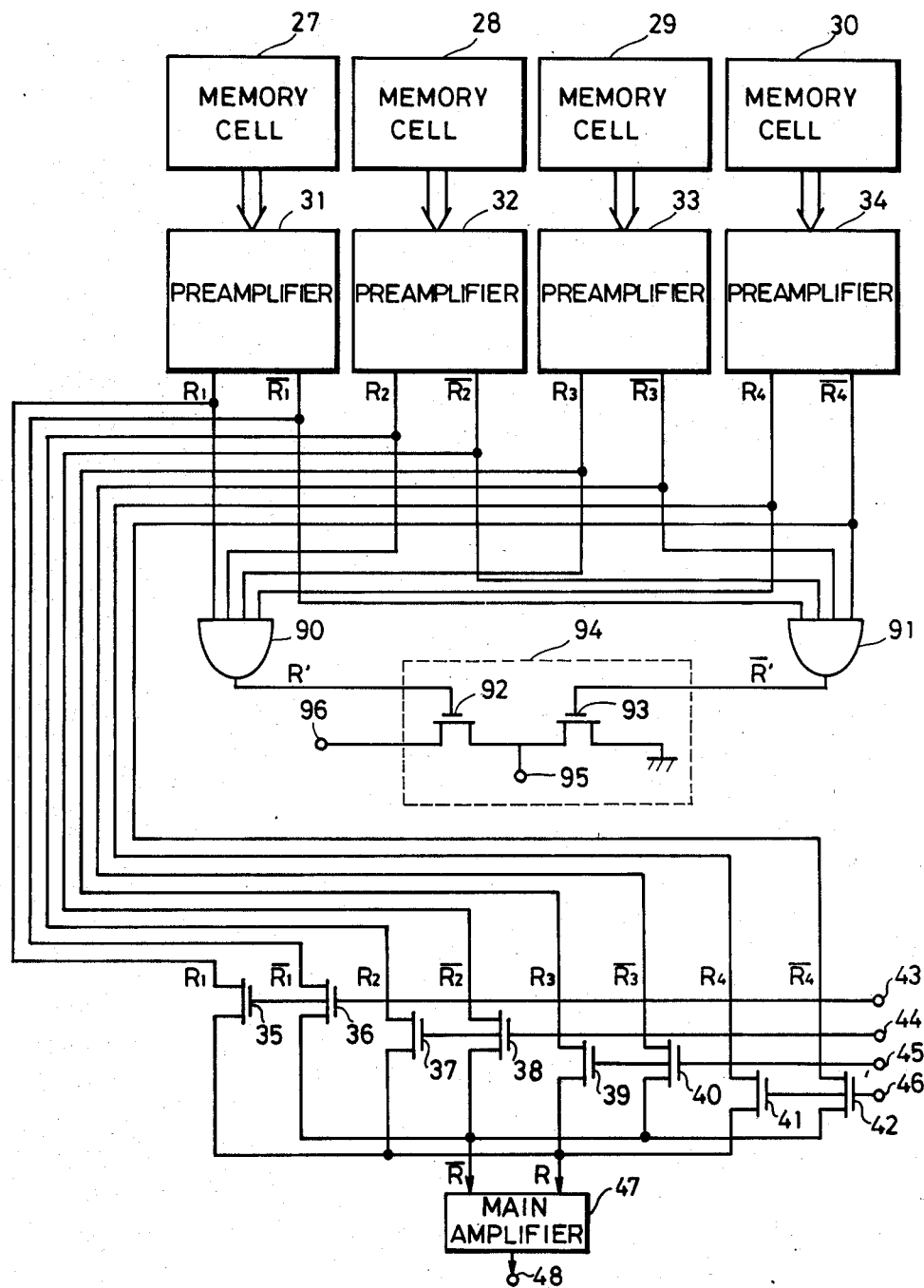
FIG. 8 is a schematic block diagram showing a semiconductor memory according to a third embodiment of the present invention.

FIG. 8 is a schematic block diagram showing electrical structure of a semiconductor memory according to a third embodiment of the present invention.

The structure of the embodiment as shown in FIG. 8 is identical to that of the conventional semiconductor memory as shown in FIG. 2 except for the following points:

The semiconductor memory as shown in FIG. 8 is provided with an AND gate 90 which receives internal output signals $R_1$ to $R_4$ outputted from respective ones of preamplifiers 31 to 34, an AND gate 91 which receives signals to $\overline{R_1}$ to $\overline{R_4}$ and an output circuit 94 which is formed by a transistor 92 having a control terminal coupled to the output of the AND gate 90 and a transistor 93 having a control terminal coupled to the output of the AND gate 91. In further detail, one conducting terminal of each of transistors 92 and 93 is coupled to form a testing external output terminal 95, while the other conducting terminal of the transistor 92 is coupled to a terminal 96 for supplying a signal at a high level and prescribed voltage in the function tests of memory cells and the other conducting terminal of the transistor 93 is grounded.

Description is now made on the operation of the third embodiment as shown in FIG. 8.

In the memory cell function tests, for example, logical values of "0" are written in all of the memory cells by a memory testing device (not shown). If the respective memory cells function correctly, the written values of "0" will be directly read from the memory cells, while if "1" output is included the corresponding memory cell is decided as defective. Assuming that the respective memory cells function correctly in the embodiment as shown in FIG. 8, the internal output signals $R_1$ to $R_4$ read by the respective preamplifiers 31 to 34 become "0", which is equal to the previously written logical values, and the complementary signals to $\overline{R}_1$ to $\overline{R}_4$ become "1".

As shown in FIG. 8, the AND gate 90 outputs an AND signal R' of the four internal output signals $R_1$ to $R_4$ while the AND gate 91 outputs an AND signal $\overline{R}'$ of the four internal output signals $\overline{R}_1$ to $\overline{R}_4$. In other words, the output R' from the AND gate 90 is "1" only when all of the signals $R_1$ to $R_4$ are at the level "1", and it becomes "0" in other case. The output $\overline{R}'$ from the AND gate 91 is "1" only when all of the signals $\overline{R}_1$ to $\overline{R}_4$ are at the level "1", and it becomes "0" in other case. The output $\overline{R}'$ from AND gate 91 is "1" only when all of the signals $\overline{R}_1$ to $\overline{R}_4$ are at the level "1", and it becomes "0" in other case.

Namely, when all of the signals $R_1$ to $R_4$ are at the level "1", all of the internal output signals in complementary relation thereto become "0", and hence R'="1" and $\overline{R}'$="0" in this case.

On the other hand, when all of the signals $R_1$ to $R_4$ are at the level "0", all of the internal output signals $\overline{R}_1$ to $\overline{R}_4$ in complementary relation thereto become "1", and hence R'="0" and $\overline{R}'$="1" in this case.

In other case, i.e., when the signals $R_1$ to $R_4$ include both of "0" and "1", the signals $\overline{R}_1$ to $\overline{R}_4$ also include both of "0" and "1", and both of the outputs R' and $\overline{R}'$ become "0" in this case.

In the aforementioned case of R'="1" and $\overline{R}'$"0", the transistor 92 enters an ON state and the transistor 93 enters an OFF state. A high-level signal is supplied to a terminal 96, whereby "1" is outputted at a testing external output terminal 95. Namely, in the case where all of the signals $R_1$ to $R_4$ are at the level "1", the same logical value "1" is outputted from the testing external output terminal 95.

In the case of R'="0" and $\overline{R}'$="1", the transistor 92 is turned off and the transistor 93 is turned on. One conducting terminal of the transistor 93 is grounded (connected at a low level), and "0" is outputted at the testing external output terminal 95. Namely, in the case where all of the signals $R_1$ to $R_4$ are at the level "0", the same logical value "0" is outputted from the testing external output terminal 95.

Further, in the case of R'="0" and $\overline{R}'$="0", both of the transistors 92 and 93 are turned off so that the testing external output terminal 95 enters a high-impedance state. Therefore, when the signals $R_1$ to $R_4$ include both of "0" and "1", i.e., when 4-bit memory cells corresponding to the internal output signals $R_1$ to $R_4$ include that which functions incorrectly, no output appears at the testing external output terminal 95.

Figure 9:
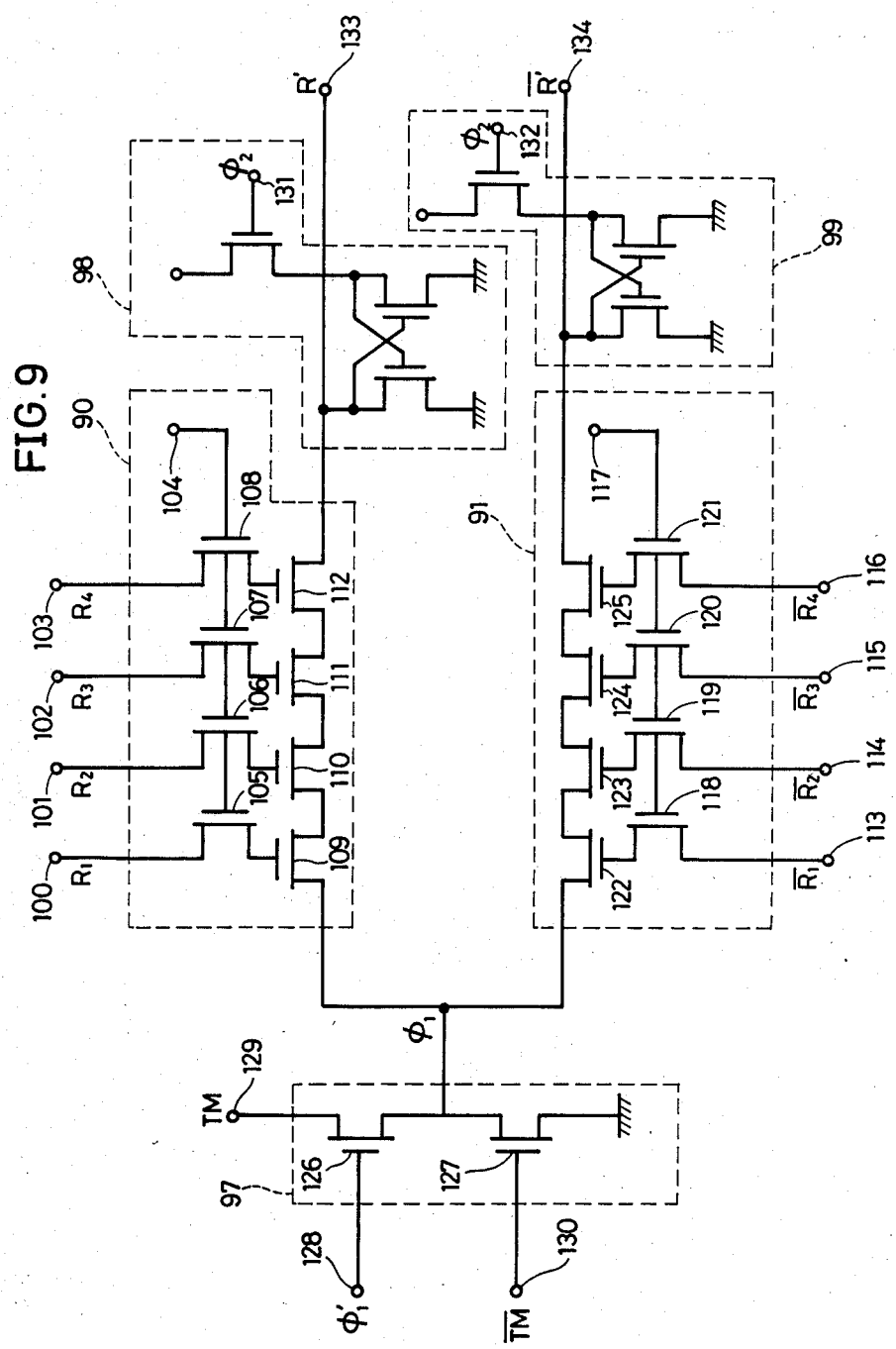
FIG. 9 is a circuit diagram showing an AND gate forming the semiconductor memory as shown in FIG. 8 in detail.

FIG. 9 illustrates details of the AND gates 90 and 91 as shown in FIG. 8 and various circuits related thereto, which are not shown in FIG. 8.

The structure of the circuit as shown in FIG. 9 is now described. The circuit as shown in FIG. 9 is mainly formed by the AND gates 90 and 91, a clock signal generating circuit 97 and latch circuits 98 and 99. Respective ones of four input terminals 100 to 103 of the AND gate 90 are supplied with the internal output signals $R_1$ to $R_4$ from the preamplifiers 31 to 34. A terminal 104 is supplied with a high-level signal, and transistors 105, 106, 107 and 108 are in ON states. Namely, the internal output signals $R_1$ to $R_4$ are supplied to the control terminals of transistors 109, 110, 111 and 112. On the other hand, respective ones of four input terminals 113 to 116 of the AND gate 91 are supplied with the internal output signals $\overline{R}_1$ to $\overline{R}_4$ to from the preamplifiers 31 to 34. A terminal 117 is supplied with a high-level signal, and transistors 118, 119, 120 and 121 are in ON states. Namely, the internal output signals $\overline{R}_1$ to $\overline{R}_4$ are supplied to the control terminals of transistors 122, 123, 124 and 125.

The clock signal generating circuit 97 is formed by transistors 126 and 127. The control terminal of the transistor 126 continuously receives basic clock signals $\phi_1'$ through an input terminal 128, while one conducting terminal of the transistor 126 receives a test mode switching signal TM, which is converted into a high level in function tests, from a memory testing device (not shown) provided in the exterior through an input terminal 129. The control terminal of the transistor 127 receives a signal $\overline{TM}$ obtained by inverting the test mode switching signal TM through an input terminal 130, while one conducting terminal of the transistor 127 is grounded. Respective other conducting terminals of the transistors 126 and 127 are coupled with each other so as to supply an input clock signal $\phi_1$ to the conducting terminals of the transistors 109 and 122 of the AND gates 90 and 91.

The output of the AND gate 90, i.e., one conducting terminal of the transistor 112 is coupled to the latch circuit 98. The latch circuit 98 is adapted to previously make the signal R' in a "0" state by a clock signal $\phi_2$ supplied to a terminal 131 which falls in a low level in advance to the rise of the clock signal $\phi_1$. The latch circuit 99 is also adapted to previously make the signal $\overline{R}'$ in a "0" state at the timing of the clock signal $\phi_2$ supplied to a terminal 132. Finally, the AND output R' of the AND gate 90 is supplied to a terminal 133 while the AND output $\overline{R}'$ of the AND gate 91 is supplied to a terminal 134.

FIGS. 10A to 10D are waveform diagrams for illustrating the operations of the circuit as shown in FIG. 9.

Figure 10A:
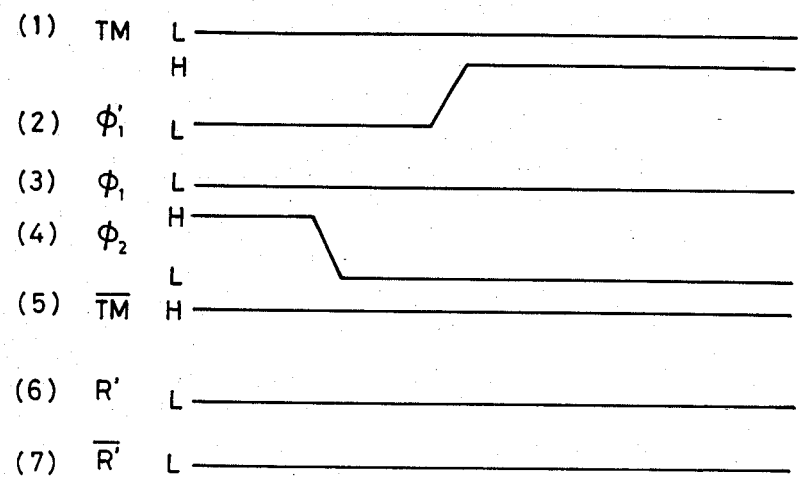

Description is now made on the operation of the circuit as shown in FIG. 9 with reference to FIGS. 10A to 10D. FIG. 10A shows the operation in a normal state (hereinafter referred to as normal mode) other than a test mode. A test mode switching signal TM supplied to the terminal 129 of the clock signal generating circuit 97 from the memory testing device provided in the exterior is at a low level (L) as shown at (1) in FIG. 10A. The signal $\overline{TM}$ obtained by inverting the signal TM is at a high level (H) as shown at (5) in FIG. 10A, whereby the transistor 127 enters an ON state. Therefore, if the basic clock signal $\phi_1'$ rises as shown at (2) in FIG. 10A, the signal $\phi_1$ continuously remains at a low level. When the signal $\phi_2$ is at a high level as shown at (4) in FIG. 10A, the latch circuits 98 and 99 so operate that the signals R' and $\overline{R}'$ are maintained at low levels as shown at (6) and (7) in FIG. 10A. However, the signal $\phi_1$ continuously remains at a low level even after the signal $\phi_2$ falls in a low level as shown at (4), and hence both of the signals R' and $\overline{R}'$ are converted into low levels, i.e., "0" as shown at (6) and (7) in FIG. 10A with no regard to the internal output signals $R_1$ to $R_4$ and $\overline{R}_1$ to $\overline{R}_4$. Thus, no output appears at the testing external output terminal 95 as shown in FIG. 8 in the normal mode.

Figure 10B:
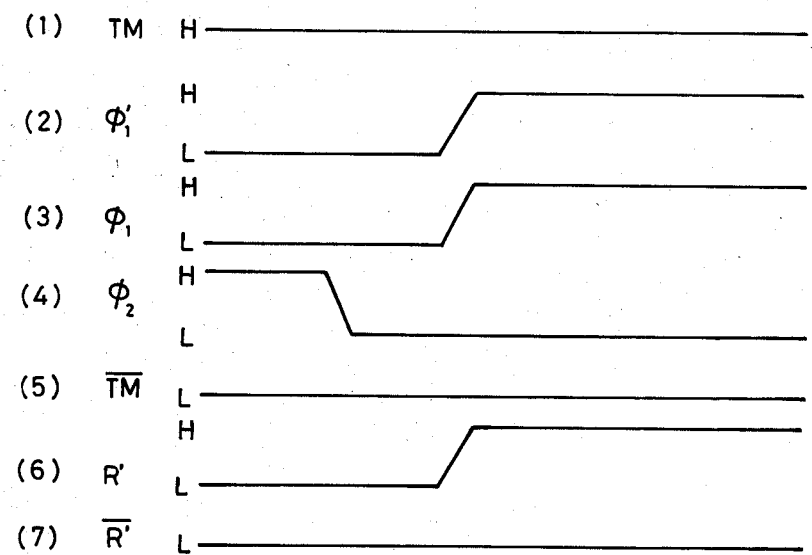

FIG. 10B shows the operation in the test mode, particularly in the case where the signals $R_1$ to $R_4$ are at the level "1". In this case, the TM signal is continuously at a high level as shown at (1) in FIG. 10B and the $\overline{TM}$ signal is continuously at a low level as shown at (5), and hence the transistor 127 is continuously in an OFF state. Therefore, as shown at (2) and (3) in FIG. 10B, the clock signal $\phi_1$ rises simultaneously with the rise of the basic clock signal $\phi_1'$. While the latch circuits 98 and 99 operate by the clock signal $\phi_2$ as shown at (4), both of the signals R' and $\overline{R}'$ are maintained at low levels. However, after the clock signal $\phi_2$ falls in a low level, all of the transistors 109 to 112 enter ON states since all of the signals $R_1$ to $R_4$ are at the level "1", and hence the high-level clock signal $\phi_1$ is outputted at R' whereby R'="1" as shown at (6). When all of the signals $R_1$ to $R_4$ are at the level "1", $\overline{R_1}$ to $\overline{R_4}$ are all "0" and hence all of the transistors 122 to 125 enter OFF states so that the signal $\overline{R}'$ become "0" of a low level. Thus, a signal of "1" is outputted at the testing external output terminal 95 as shown in FIG. 8 in the test mode.

FIG. 10C also shows the operation in the test mode, particularly in the case where the signals $R_1$ to $R_4$ are at the level "0". The TM signal is continuously at a high level as shown at (1) in FIG. 10C and $\overline{TM}$ signal is at a low level as shown at (5), and hence the transistor 127 is continuously in an OFF state. Therefore, as shown at (2) and (3) in FIG. 10C, the clock signal $\phi_1$ rises simultaneously with the rise of the basic clock signal $\phi_1'$. While the latch circuits 98 and 99 operate by the clock signal $\phi_2$ as shown at (4), the signals R' and $\overline{R}'$ are at low levels as shown at (6) and (7). However, after the clock signal $\phi_2$ falls in a low level as shown at (4), all of the transistors 109 to 112 enter OFF states since all of the signals $R_1$ to $R_4$ are at the level "0", and hence the output at R' is "0" of a low level. On the other hand, when all of the signals $R_1$ to $R_4$ are at the level "0", the signals $\overline{R_1}$ to $\overline{R_4}$ are all at the level "1", and hence all of the transistors 122 to 125 enter ON states whereby the clock signal $\phi_1$ of a high level is outputted at $\overline{R}'$ so that $\overline{R}'$="1". Thus, a signal of "0" is outputted at the testing external output terminal 95 as shown in FIG. 8 in the test mode.

FIG. 10D also shows the operation in the test mode, particularly in the case where the signals $R_1$ to $R_4$ include "0" and "1". The TM signal is continuously at a high level as shown at (1) in FIG. 10D while the $\overline{TM}$ signal is continuously at a low level as shown at (5), and hence the transistor 127 is continuously in an OFF state. Therefore, as shown at (2) and (3) in FIG. 10D, the clock signal $\phi_1$ rises simultaneously with the rise of the basic clock signal $\phi_1'$. While the latch circuits 98 and 99 operate by the clock signal $\phi_2$ as shown at (4), the signals R' and $\overline{R}'$ are at low levels as shown at (6) and (7). After the clock signal $\phi_2$ falls in a low level as shown at (4), any of the transistors 109 to 112 enters an OFF state since any one of the signals $R_1$ to $R_4$ is "0", whereby the output R' is "0" of a low level as shown at (6). On the other hand, one of the transistors 122 to 125 enters an OFF state since one of the signals $\overline{R_1}$ to $\overline{R_4}$ is "0", and hence the output R' is "0" of a low level as shown at (7). Thus, the testing external output terminal 95 as shown in FIG. 8 enters a high-impedance state, whereby no output appears at the same in the test mode.

The output circuit 94 as shown in FIG. 8 may be assembled into the main amplifier 48 so as to select either the external output in the normal mode or the testing external output of the test mode outputted from the testing external output terminal 95 in the embodiment as shown in FIG. 8 and output the same from an external output terminal 48 by switching the test mode switching signal TM.

Figure 11:
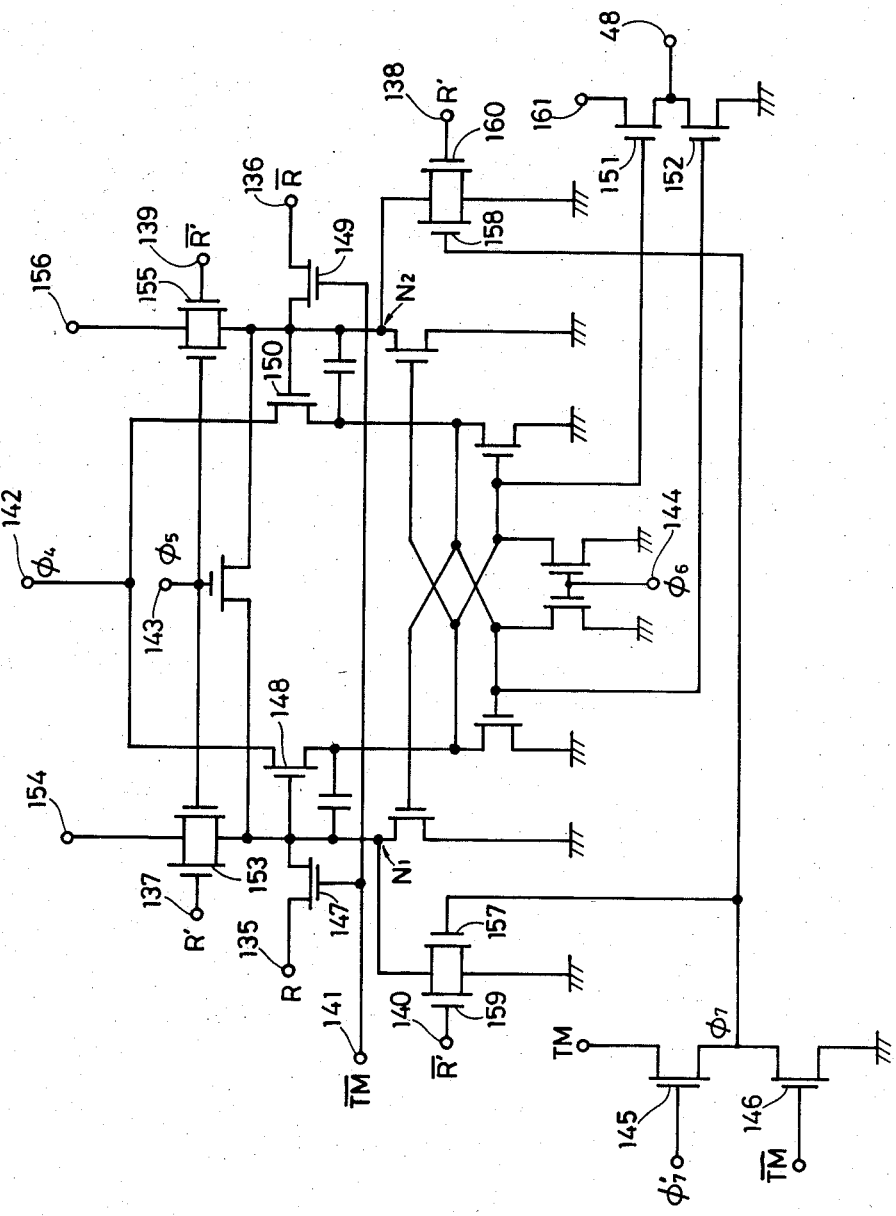
FIG. 11 is a circuit diagram showing a main amplifier forming the semiconductor memory as shown in FIG. 8.

FIG. 11 is a circuit diagram showing a main amplifier 47 also serving as the aforementioned testing external output circuit. Description is now made on the structure of the circuit as shown in FIG. 11.

A terminal 135 receives an internal signal R selected by a normal subdecode signal while a terminal 136 receives an internal signal R also selected by a subdecode signal. Terminals 137 and 138 receive the output R' from an AND gate 90, while terminals 139 and 140 receive the output $\overline{R}'$ from an AND gate 91. A terminal 141 receives a $\overline{TM}$ signal obtained by inverting a TM signal and a terminal 142 receives a signal $\phi_4$ for activating the entire main amplifier 47 while a terminal 143 receives an equalizing signal $\phi_5$ in advance of activation of the main amplifier 47 and a terminal 144 also receives an equalizing signal $\phi_6$. Transistors 145 and 146 are adapted to function as circuits for generating a signal $\phi_7$ for converting nodes $N_1$ and $N_2$ into low levels before the entire main amplifier 47 is activated by the signal $\phi_4$ only in a test mode. The signal R supplied to the terminal 135 is coupled to the control terminal of a transistor 148 which is coupled to the activating signal $\phi_4$ through a transistor 147 which is controlled by the $\overline{TM}$ signal. The signal $\overline{R}$ supplied to the terminal 136 is coupled to the control terminal of a transistor 150 which is coupled to the activating signal $\phi_4$ through a transistor 149 which is controlled by the $\overline{TM}$ signal. Further, one conducting terminal of the transistor 148 is coupled to the control terminal of a transistor 151 forming the output circuit while one conducting terminal of a transistor 150 is coupled to the control terminal of a transistor 152 also forming the output circuit. The signal R' received by the terminal 137 is supplied to the control terminal of a transistor 153, and a high level signal of prescribed voltage supplied from a terminal 154 is coupled to the control terminal of the transistor 148 through the transistor 153. The signal $\overline{R}'$ received by the terminal 139 is supplied to the control terminal of a transistor 155, while a high level signal of prescribed voltage supplied from a terminal 156 is coupled to the control terminal of the transistor 150 through the transistor 155. When the TM signal is at a high level in the test mode, the transistor 146 is turned off so that a basic clock signal $\phi_7'$ is outputted as an input clock signal $\phi_7$ from one conducting terminal of the transistor 145, to be supplied to the control terminals of transistors 157 and 158. Further, the signal $\overline{R}'$ received by the terminal 140 is coupled to the control terminal of a transistor 159, while the signal R' received by the terminal 138 is coupled to the control terminal of a transistor 160.

A high level signal is supplied to a terminal 161, and when the control terminals of the transistors 151 and 152 receive signals of high and low levels respectively, a high level signal "1" is outputted at an external output terminal 48, and a low level signal "0" is outputted at the external output terminal 48 when the control terminals of the transistors 151 and 152 receive signals of low and high levels, respectively, while the external output terminal 48 enters a high-impedance state (open state) when both of the control terminals of the transistors 151 and 152 receive signals of a low level.

FIGS. 12A to 12D are waveform diagrams for illustrating the operations of the circuit as shown in FIG. 11.

Figure 12A:
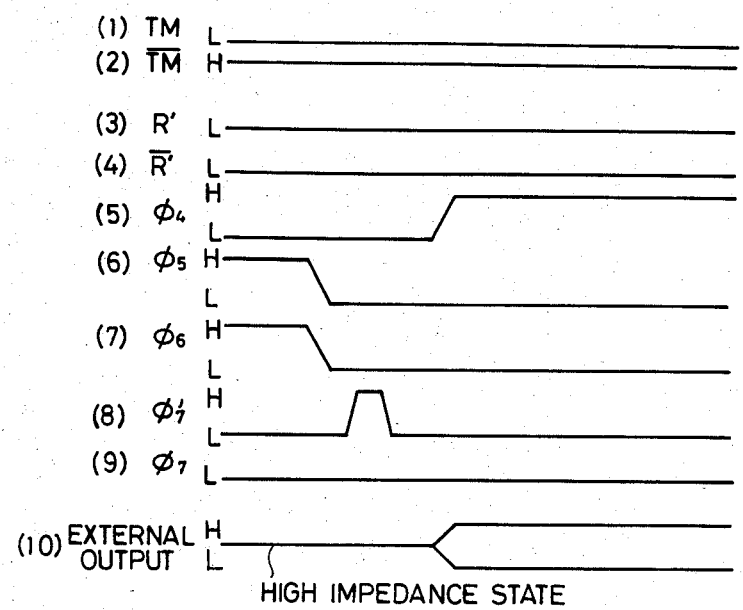
FIGS. 12A to 12D are waveform diagrams for illustrating the operations of the circuit as shown in FIG. 11.

Referring now to FIGS. 12A to 12D, description is made on the operations of the circuit as shown in FIG. 11. FIG. 12A shows the operation in the normal mode, in which the TM signal is at a low level and the $\overline{TM}$ signal is at a high level whereby the transistors 147 and 149 enter ON states. Therefore, the signals R and $\overline{R}$ are supplied to the control terminals of the transistors 148 and 150. When the signal $\phi_4$ rises at a high level at the timing as shown at (5), the signal R received by the control terminal of the transistor 148 is thereafter supplied to the control terminal of the transistor 151 while the signal R received by the control terminal of the transistor 150 is supplied to the control terminal of the transistor 152, so that the external output terminal 48 outputs a signal of the normal mode as shown at (10).

Figure 12B:
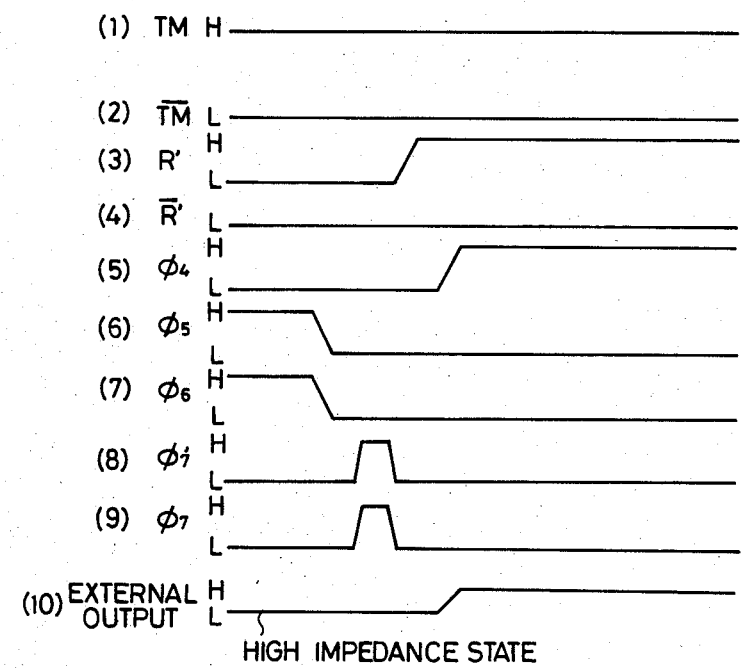

FIG. 12B is a waveform diagram for illustrating the operation in the test mode particularly in the case where R'="1" ($R_1$ to $R_4$="1") and $\overline{R'}$="0" ($\overline{R_1}$ to $\overline{R_4}$="0"). In this case, the TM signal is at a high level and the $\overline{TM}$ signal is at a low level, whereby the transistors 147 and 149 enter OFF states. When the signal $\phi_4$ rises at a high level at the timing shown at (5), the signal R' received by the control terminal of the transistor 153 is thereafter supplied to the control terminal of the transistor 151 while the signal $\overline{R'}$ received by the control terminal of the transistor 155 is supplied to the control terminal of the transistor 152, so that the external output terminal 48 outputs the logical value "1" which is equal to those of the signals $R_1$ to $R_4$ as shown at (10).

Figure 12C:
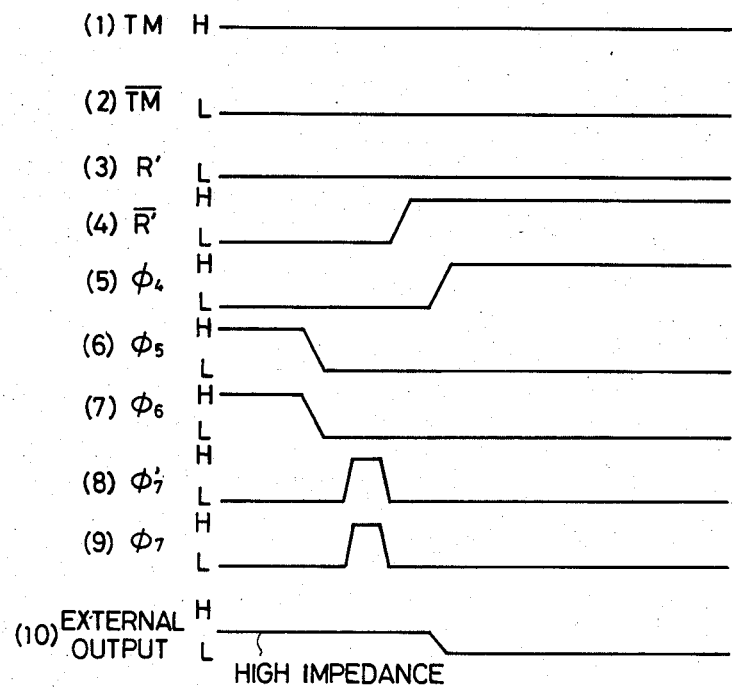

FIG. 12C is a waveform diagram for illustrating the operation in the test mode particularly in case where R'="0" ($R_1$ to $R_4$="0") and $\overline{R_1}$="1"($\overline{R_1}$ to $\overline{R_4}$="1"). The TM signal is at a high level and the $\overline{TM}$ signal is at a low level, whereby the transistors 147 and 149 enter OFF states. When the signal $\phi_4$ rises at a high level at the timing shown at (5), the signal R' received by the control terminal of the transistor 153 is thereafter supplied to the control terminal of the transistor 151 while the signal R' received by the control terminal of the transistor 155 is supplied to the control terminal of the transistor 152, whereby the external output terminal 48 outputs the logical value "0" which is equal to those of $R_1$ to $R_4$ as shown at (10).

Figure 12D:
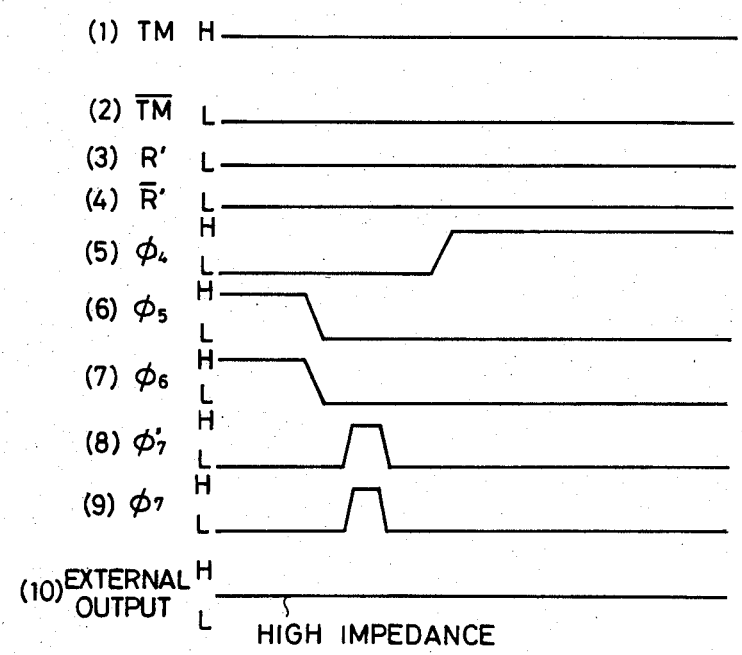

FIG. 12D is a waveform diagram for illustrating the operation in the test mode particularly in case where R'="0" ($R_1$ to $R_4$ include "0" and "1") and $\overline{R'}$="0" ($\overline{R_1}$ to $\overline{R_4}$ include "0" and "1"). In this case, the TM signal is at a high level and the $\overline{TM}$ signal is at a low level whereby the transistors 147 and 149 enter OFF states. When the signal $\phi_4$ rises at a high level at the timing shown at (5), the signal R' received by the control terminal of the transistor 153 is thereafter supplied to the control terminal of the transistor 151 while the signal $\overline{R'}$ received by the control terminal of the transistor 155 is supplied to the control terminal of the transistor 152, whereby the external output terminal 48 enters a high-impedance state as shown at (10).

As hereinabove described, the storage contents of the 4-bit memory cells are unified to an AND output signal (4-bit degenerate signal) by employing AND gates, thereby to enable a decision that the logical values outputted from the external output terminal are stored in all of the 4-bit memory cells. If the logical values are equal to those previously written in the memory cells for the function tests, all of the 4-bit memory cells can be considered to function correctly. When no logical value is outputted, i.e., when the external output terminal is in a high-impedance state, it is recognized that the 4-bit memory cells include those storing "0" and those storing "1" and at least one of the memory cells is defective.

When it is necessary to further specify the defective cell included in the 4-bit memory cells, the test mode may be switched to the normal mode to sequentially read the group of 4-bit memory cells including the defective cell by a general readout means to make decisions bit by bit.

Although the above description of the respective embodiments has been made with respect to a semiconductor memory in which data are written in 4-bit memory cells from one data writing terminal and that in which storage contents from 4-bit memory cells are read at an external output terminal, the number of bits is not restricted to four and the semiconductor memory may be implemented in any desired type such as a dynamic type semiconductor device.

Further, the plurality of bits of simultaneous writing means according to the first embodiment and the plurality of bits of simultaneous writing means according to the second or third embodiment may be associated with each other to further reduce the test time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
   a data writing terminal;
   n-bit memory cells coupled in parallel to said data writing terminal, n being an integer not less than 2;
   designating signal generating means for generating memory cell designating signals for designating any one of said n-bit memory cells to be written with data;
   memory cell writing means of said number n each provided for respective ones of said n-bit memory cells for receiving said memory cell designating signals respectively from said designating signal generating means thereby to write data in designated memory cells; and
   driving signal generating means operative during a memory test mode of operation of said memory for generating driving signals for simultaneously driving all of said memory cell writing means of said number n to write memory function test data in said memory cells.

2. A semiconductor memory in accordance with claim 1, wherein
   said driving signal generating means have switching means switched in response to control signals from an external source of control signals to supply said driving signals to said memory cell writing means of said number n when memory function test data are being written in said memory cells and to supply said memory cell designating signals to said memory cell writing means of said number n when memory function test data are not being written in said memory cells.

3. A semiconductor memory in accordance with claim 1, wherein
   said driving signal generating means are provided with timing signal generating means for generating timing signals to which data writing in said data writing terminal in synchronized, while generating said driving signals in response to said timing signals.

4. A semiconductor memory comprising:
   n-bit memory cells, n being an integer not less than 2;
   internal output signal generating means of said number n each provided for respective ones of said n-bit memory cells for reading logical values held in respective said n-bit memory cells to output the same;
   signal selecting means for selecting one value from said logical values of said number n outputted from respective ones of said internal output signal generating means of said number n;

a data reading terminal for externally outputting said one logical value selected by said signal selecting means;

test data output means connected to said internal output signal generating means of said number n for outputting data from said internal output signal generating means as memory cell function test data; and test mode switching means responsive to a memory function test mode of operation of the memory for activating said test data output means only in readout of said memory cell function test data.

5. A semiconductor memory in accordance with claim 4, wherein said test data output means are implemented by parallel readout means of said number n for directly outputting said logical values of said number n outputted from said internal output signal generating means of said number n in a parallel manner.

6. A semiconductor memory in accordance with claim 5, wherein said internal output signal generating means respectively output logical values in complementary relation to said logical values read from said memory cells, respective one of said parallel readout means of said number n comprising:

an output terminal, a first signal source for supplying high-level signals, a second signal source for supplying low-level signals, first switching means having a control terminal connected to said internal output signal generating means for receiving said logical value held in said memory cell, a first conducting terminal connected to said output terminal, and second switching means having a control terminal connected to said internal output signal generating means for receiving said logical value in said complementary relation, a first conducting terminal connected to said second signal source and a second conducting terminal connected to said output terminal, and said test mode switching means comprising:

third switching means for receiving a control signal from an external source of control signals in said readout of said memory cell function test data thereby to make continuity between said internal output signal generating means and said control terminal of said first swtiching means, and fourth switching means for receiving said control signal from the external source of control signals in said readout of said memory cell function test data thereby to make continuity between said internal output signal generating means and said control terminal of said second switching means.

7. A semiconductor memory in accordance with claim 4, wherein said test data output means is implemented by logic circuit means which outputs corresponding logical value when all of said logical values of said number n outputted from said internal output signal generating means of said number n are at the same level.

8. A semiconductor memory in accordance with claim 7, wherein said internal output signal generating means respectively output logical values in complementary relation to said logical values read from said memory cells, said logic circuit means comprising:

an output terminal, a third signal source for supplying high-level signals, a fourth signal source for supplying low-level signals, a first AND circuit for outputting the logical product of n-bit logical values held in said n-bit memory cells outputted from said internal output signal generating means of said number n, a second AND circuit for outputting the logical product of n-bit logical values in said complementary relation outputted from said internal output signal generating means of said number n, fifth switching means having a control terminal connected to the output of said first AND circuit, a first conducting terminal connected to said third signal source and a second conducting terminal connected to said output terminal, and sixth switching means having a control terminal connected to the output of said second AND circuit, a first conducting terminal connected to said fourth signal source and a second conducting terminal connected to said output terminal.

9. A semiconductor memory in accordance with claim 8, wherein said driving signal generating means have seventh switching means switched in response to a control signal from an external source of control signals to supply said driving signals to said memory cell writing means of said number n said memory cell function test data are being written in said memory cells and to supply said memory cell designating signals to said memory cell writing means of said number n when said memory cell function test data are not being written into said memory cells.

10. A semiconductor memory in accordance with claim 7, wherein the output of said logic circuit means is generated through said data reading terminal.

11. A semiconductor memory in accordance with claim 4, further comprising:

a data writing terminal connected to said n-bit memory cells, designating signal generating means for generating memory cell designating signals for designating any one of said n-bit memory cells to be written with data, memory cell writing means of said number n each provided for respective ones of said n-bit memory cells for receiving said mcmory cell designating signals respectively from said designating signal generating means thereby to write said data in said designated memory cells, and driving signal generating means operative during a memory test mode of operation of said memory for generating driving signals for simultaneously driving all of said memory cell writing means of said number n to write said memory cell function test data in said memory cells.

12. A semiconductor memory in accordance with claim 11, wherein said driving signal generating means are further provided with timing signal generating means for generating timing signals to which data writing in said data writing terminal is synchronized while generating said driving signals in response to said timing signals.

* * * * *